United States Patent

Crotzer et al.

[11] Patent Number: 5,871,842
[45] Date of Patent: Feb. 16, 1999

[54] GRAFTED THERMOPLASTIC ELASTOMER BARRIER LAYER

[75] Inventors: David R. Crotzer, Nashua, N.H.; Neill N. Silva, Greenville, R.I.

[73] Assignee: Thomas & Betts International, Inc., Sparks, Nev.

[21] Appl. No.: 763,630

[22] Filed: Dec. 4, 1996

Related U.S. Application Data

[63] Continuation-in-part of Ser. No. 736,830, Oct. 28, 1996.

[51] Int. Cl.⁶ .............................. B23B 27/34; B23B 27/40
[52] U.S. Cl. ................... 428/334; 428/423.5; 428/425.5; 428/451
[58] Field of Search ..................... 428/328, 334, 428/425.5, 451, 423.5

[56] References Cited

U.S. PATENT DOCUMENTS

| | | | |
|---|---|---|---|
| 5,004,643 | 4/1991 | Caldwell | 428/246 |
| 5,202,275 | 4/1993 | Sugiura et al. | 437/41 |
| 5,209,965 | 5/1993 | Caldwell | 428/260 |
| 5,306,558 | 4/1994 | Takahashi et al. | 428/331 |
| 5,334,804 | 8/1994 | Love et al. | 174/267 |
| 5,403,700 | 4/1995 | Heller et al. | 430/311 |
| 5,418,051 | 5/1995 | Caldwell | 428/240 |
| 5,468,562 | 11/1995 | Farivar et al. | 428/457 |
| 5,469,853 | 11/1995 | Law et al. | 128/662.06 |
| 5,488,380 | 1/1996 | Harvey et al. | 342/368 |
| 5,498,467 | 3/1996 | Meola | 428/198 |
| 5,519,172 | 5/1996 | Spencer et al. | 174/110 R |

FOREIGN PATENT DOCUMENTS 55-007-391   2/1980   Japan.

*Primary Examiner*—D. S. Nakarani
*Attorney, Agent, or Firm*—Weingarten, Schurgin, Gagnebin & Hayes LLP

[57] ABSTRACT

A thermoplastic elastomer barrier layer is disclosed. The thermoplastic elastomer barrier layer may be grafted to a substrate for preventing contaminants from permeating through the substrate or for preventing contaminants, which may permeate through the substrate, from permeating beyond the substrate. The thermoplastic elastomer barrier layer is grafted to the substrate by a thermal grafting process.

18 Claims, 4 Drawing Sheets

GRAFTED THERMOPLASTIC ELASTOMER BARRIER LAYER

CROSS-REFERENCE TO RELATED APPLICATIONS

This patent application is a continuation-in-part patent application of U.S. patent application Ser. No. 08/736,830 filed Oct. 28, 1996, now pending.

FIELD OF INVENTION

The present invention relates generally to elastic materials and, more particularly, to a thermoplastic elastomer barrier layer that is grafted to a substrate for preventing contaminants from permeating through the substrate or for preventing contaminants, which may permeate through the substrate, from permeating beyond the substrate.

BACKGROUND OF THE INVENTION

Silicon rubber keypads are used in a variety of electronic products ranging from telephones to calculators. Manufacturers of these products typically want to extend the life of these products for as long as possible. This is particularly desirable for widely known manufacturers having a reputation for providing highly reliable products.

Unfortunately, the use of silicon rubber keypads in electronic products can result in the premature failure of the electronic products. For example, a cellular telephone is typically constructed with a printed circuit board and a mating silicon rubber keypad. The printed circuit board will typically have a plurality of electrically conductive contacts formed on its mating surface, and the silicon rubber keypad will typically have a corresponding plurality of electrically conductive contacts associated with its mating surface. In operation, a user of the cellular telephone will use his/her fingers to apply pressure to the silicon rubber keypad so as to cause electrical connections to be made between corresponding electrically conductive contacts.

Over time, the silicon rubber keypad usually comes into contact with contaminants such as creams, lotions, and oils. These contaminants may come directly from the fingers of the user or from some other source. Regardless of where they originate, these contaminants may permeate through the silicon rubber keypad and cause corrosion and connection problems with the electrically conductive contacts. This permeation is usually aided by the application of pressure to the silicon rubber keypad.

In view of the foregoing, it would obviously be beneficial to provide a means for preventing contaminants from permeating through the silicon rubber keypad or for preventing contaminants, which may permeate through the silicon rubber keypad, from permeating beyond the silicon rubber keypad so as to prevent corrosion and connection problems with the electrically conductive contacts. In broader terms, it would be beneficial to provide a means for preventing contaminants from permeating through or beyond any type of substrate material which would otherwise allow such contaminant permeation to occur.

SUMMARY OF THE INVENTION

The primary object of the present invention is to provide a thermoplastic elastomer barrier layer that is grafted to a substrate for preventing contaminants from permeating through the substrate or for preventing contaminants, which may permeate through the substrate, from permeating beyond the substrate. In one particular embodiment, the present invention is realized as a layered composition comprising: a substrate having a top surface and a bottom surface, wherein the substrate is formed of a material which allows contaminants to permeate therethrough; and a first barrier layer that is grafted to at least a portion of the bottom surface of the substrate, wherein the first barrier layer is formed of a thermoplastic elastomer material which prevents contaminants from permeating therethrough. An elastic conductive layer may be grafted to at least a portion of the surface of the first barrier layer. Also, a second barrier layer may be grafted to at least a portion of the top surface of the substrate, wherein the second barrier layer is formed of a thermoplastic elastomer material which prevents contaminants from permeating therethrough. The grafting of the layers is performed by a thermal grafting process.

In view of the foregoing, it is readily apparent how the present invention overcomes the shortcomings of the above-mentioned prior art. The above-stated primary object, as well as other objects, features, and advantages, of the present invention will become even more readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Figure 1:
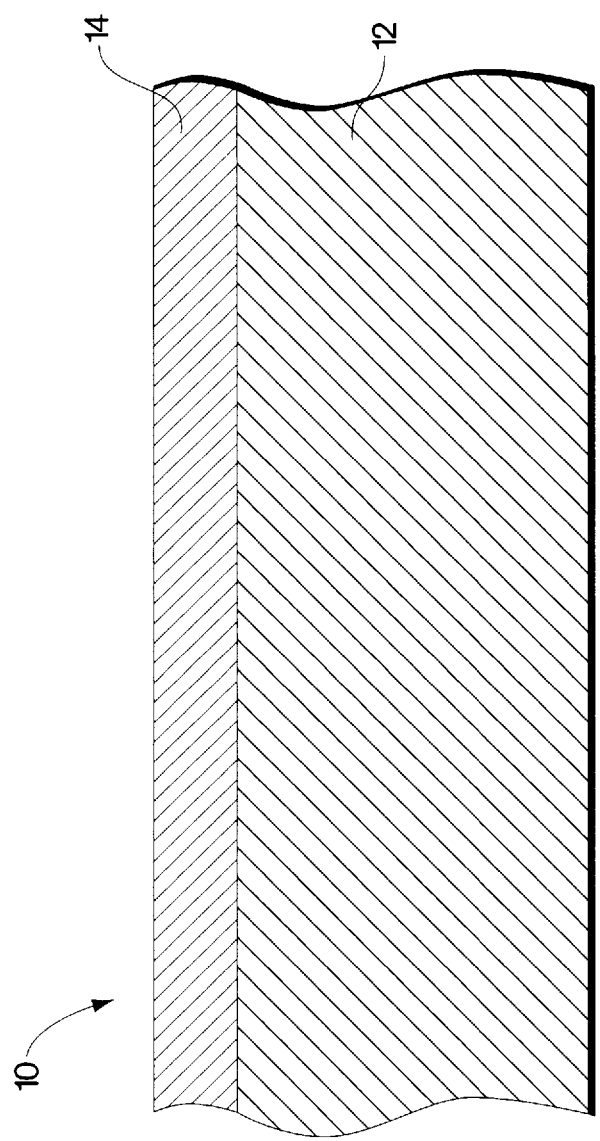
FIG. 1 is a cross-sectional view of a layered composition having a thermoplastic elastomer barrier layer according to the present invention.

Referring to FIG. 1, there is shown a cross-sectional view of a layered composition 10 comprising a substrate 12 and a thermoplastic elastomer barrier layer 14. For the thermoplastic elastomer barrier layer 14 to be most useful, the substrate 12 should be fabricated of a material which allows contaminants such as creams, lotions, and oils to permeate therethrough. For example, the substrate may be fabricated of an elastic material such as silicone rubber, a flexible material such as the thermoplastic polyamide (known by the trade name nylon™), or a rigid material such as the thermoplastic polyamide-imide (known by the trade name ultem™). The thermoplastic elastomer barrier layer 14 may be fabricated of a thermoplastic elastomer such as, for example, a thermoplastic polyurethane elastomer or a thermoplastic polyolefin elastomer.

The layered composition 10 may be fabricated by a thermal grafting process which typically begins by providing the substrate 12 in a fully cured state. The thermoplastic elastomer barrier layer 14 is then deposited on the substrate 12 by spray coating or any other known means. The layered structure is then subjected to a thermal cycle whereby the thermoplastic elastomer barrier layer 14 is fully cured and grafted to the substrate 12. During this thermal grafting process, polymer chains in the thermoplastic elastomer barrier layer 14 are grafted to polymer chains in the substrate 12 so as to form a strong bond between the thermoplastic elastomer barrier layer 14 and the substrate 12. This thermal grafting process eliminates the need to etch or otherwise pretreat the surface of the elastic substrate 12.

There is generally no limitation on the thickness of the substrate 12. The thickness of the thermoplastic elastomer barrier layer 14, however, need typically only be in the range of 0.5 to 5.0 mils in order to prevent contaminants, which may permeate through the substrate 12, from permeating beyond the substrate 12.

It should be noted that the substrate 12 and the thermoplastic elastomer barrier layer 14 must be fabricated of materials having equal or substantially equal coefficients of expansion. This is required so that the strong bond that is achieved between the substrate 12 and the thermoplastic elastomer barrier layer 14 through the thermal grafting process is maintained over temperature.

Thermoplastic elastomers typically provide very good oil and chemical resistance, and their thermoplastic properties allow them to be reheated and reflowed for reshaping. After they are cooled, they possess elastic properties. For obvious reasons, the elastic properties of a thermoplastic elastomer are particularly beneficial when the substrate to which the thermoplastic elastomer is grafted to also possesses elastic properties. The elastic properties of a thermoplastic elastomer are also beneficial if the substrate to which the thermoplastic elastomer is grafted to is merely flexible since the thermoplastic elastomer can conform to any shape that is adopted by the flexible substrate. If the substrate to which the thermoplastic elastomer is grafted to is rigid, it would seem that the only beneficial property of the thermoplastic elastomer is contamination resistance, but the elastic properties may still be beneficial as will be described below.

Figure 2:
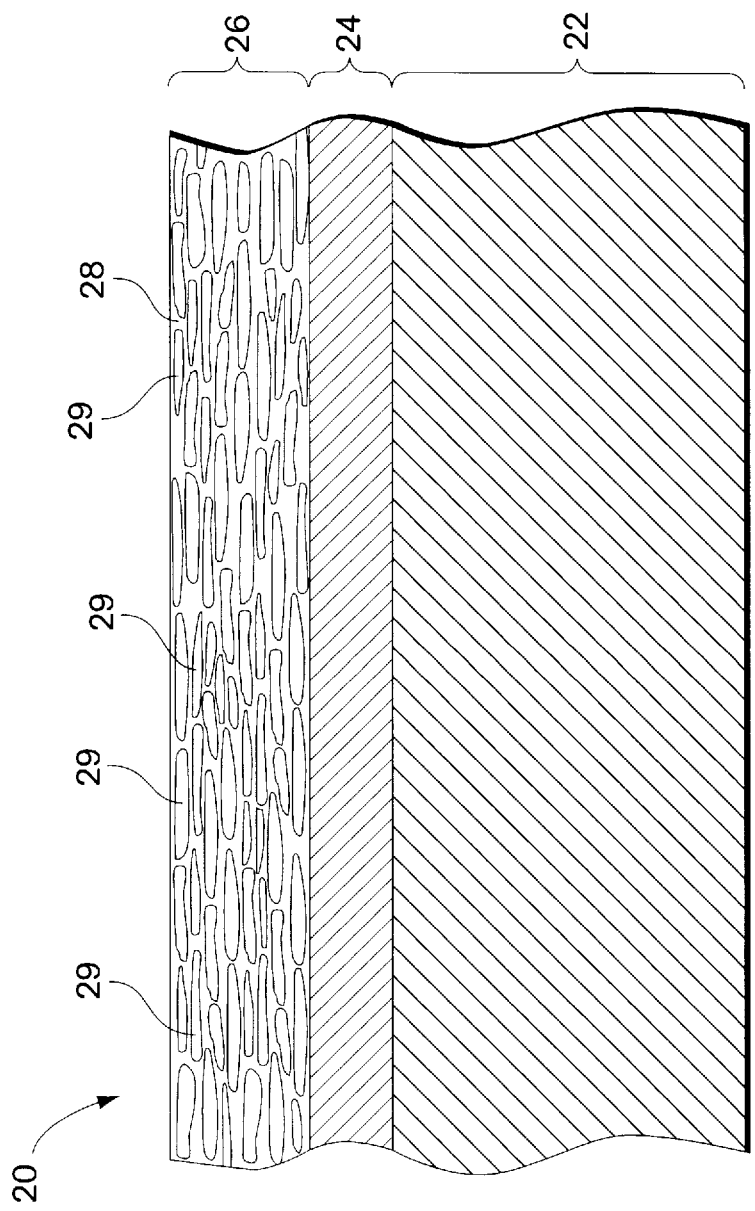
FIG. 2 is a cross-sectional view of a layered composition having a thermoplastic elastomer barrier layer and an elastic conductive layer according to the present invention.

Referring to FIG. 2, there is shown a cross-sectional view of a layered composition 20 comprising an elastic substrate 22, a thermoplastic elastomer barrier layer 24, and an elastic conductive layer 26. In this particular embodiment, the elastic substrate 22 is fabricated of silicone rubber, and the thermoplastic elastomer barrier layer 24 is fabricated of a thermoplastic polyolefin elastomer. As previously indicated, silicone rubber is a material that allows contaminants such as creams, lotions, and oils to permeate therethrough.

The elastic conductive layer 26 comprises a mixture of an elastic material 28 and a quantity of conductive flakes 29. The elastic material 28 may be fabricated of an elastic material such as, for example, silicone rubber. Alternatively, the elastic material 28 may be fabricated of a thermoplastic elastomer such as, for example, a thermoplastic polyolefin elastomer.

The conductive flakes 29 may be fabricated of a conductive or semiconductive material such as, for example, silver, nickel, or carbon. Alternatively, the conductive flakes 29 may be fabricated of a conductive, semiconductive, or insulative material which is coated with or has interspersed therein other conductive or semiconductive materials such as, for example, silver, nickel, or carbon. The size and the amount of the conductive flakes 29 may vary depending on the level of conductivity that is required. The elastic conductive layer 26 is similar to the elastic conductive layers disclosed and described in U.S. pat. application Ser. No. 08/736,830, which was filed Oct. 28, 1996, and which is hereby incorporated by reference.

The layered composition 20 may be fabricated by a thermal grafting process which typically begins by providing the elastic substrate 22 in a fully cured state. The thermoplastic elastomer barrier layer 24 is then deposited on the elastic substrate 22 by spray coating or any other known means. The elastic conductive layer 26 is then deposited on the thermoplastic elastomer barrier layer 24 also by spray coating or any other known means. The entire layered structure is then subjected to a thermal cycle whereby the thermoplastic elastomer barrier layer 24 is fully cured and grafted to the elastic substrate 22, and the elastic conductive layer 26 is fully cured and grafted to the thermoplastic elastomer barrier layer 24. During this thermal grafting process, polymer chains in the thermoplastic elastomer barrier layer 24 are grafted to polymer chains in the elastic substrate 22 so as to form a strong bond between the thermoplastic elastomer barrier layer 24 and the elastic substrate 22. Likewise, polymer chains in the elastic conductive layer 26 are grafted to polymer chains in the thermoplastic elastomer barrier layer 24 so as to form a strong bond between the elastic conductive layer 26 and the thermoplastic elastomer barrier layer 24. This thermal grafting process eliminates the need to etch or otherwise pretreat the surface of the elastic substrate 22.

Similar to the layered composition 10 described in FIG. 1, the elastic substrate 22 and the thermoplastic elastomer barrier layer 24 must be fabricated of materials having equal or substantially equal coefficients of expansion so that the strong bond that is achieved between the elastic substrate 22 and the thermoplastic elastomer barrier layer 24 through the thermal grafting process is maintained over temperature. It is also important that the thermoplastic elastomer barrier layer 24 and the elastic conductive layer 26 be fabricated of materials having equal or substantially equal coefficients of expansion for similar reasons.

The layered composition 20 is functional in that the thermoplastic elastomer barrier layer 24 prevents contaminants, which may permeate through the elastic substrate 22, from reaching the elastic conductive layer 26. If the elastic conductive layer 26 is itself fabricated of a material which allows contaminants to permeate therethrough (e.g., silicone rubber), then the thermoplastic elastomer barrier layer 24 will prevent such contaminants from ever reaching and then permeating through the elastic conductive layer 26, thereby preventing corrosion and connection problems in the elastic conductive layer 26 and any associated electrically conductive contacts. Even if the elastic conductive layer 26 is fabricated of a material which does not by itself allow contaminants to permeate therethrough (e.g., a thermoplastic polyolefin elastomer), the quantity of conductive flakes 29 can make the elastic conductive layer 26 susceptible to contaminant permeation since openings or crevices which may develop around the conductive flakes may allow contaminants to permeate through the elastic conductive layer 26. However, since the thermoplastic elastomer barrier layer 24 prevents contaminants from ever reaching the elastic conductive layer 26, such contaminant permeation will not occur.

It should be noted that, in general, it is not recommended that the elastic conductive layer 26 be grafted directly to the elastic substrate 22 because the quantity of conductive flakes 29 is typically too abundant to allow a sufficient number of polymer chains in the elastic conductive layer 26 to be grafted to polymer chains in the elastic substrate 22. That is, the bond between the elastic conductive layer 26 and the elastic substrate 22 would not be as strong as the bond between the thermoplastic elastomer barrier layer 24 and the elastic substrate 22 due to the presence of the conductive flakes 29 in the elastic conductive layer 26. The thermoplastic elastomer barrier layer 24 acts as a primer for grafting the elastic conductive layer 26 in the layered composition 20.

One particular application wherein the above-described layered composition 20 would be useful is a telephone or calculator keypad wherein an electrical connection must be made by pressing a key on the keypad. If such a keypad were to be fabricated of a material which allows contaminants to permeate therethrough (e.g., silicone rubber), then a thermoplastic elastomer barrier layer could be grafted to the bottom surface of the keypad according to the above-described process so as to prevent any contaminants from permeating beyond the keypad.

Figure 3:
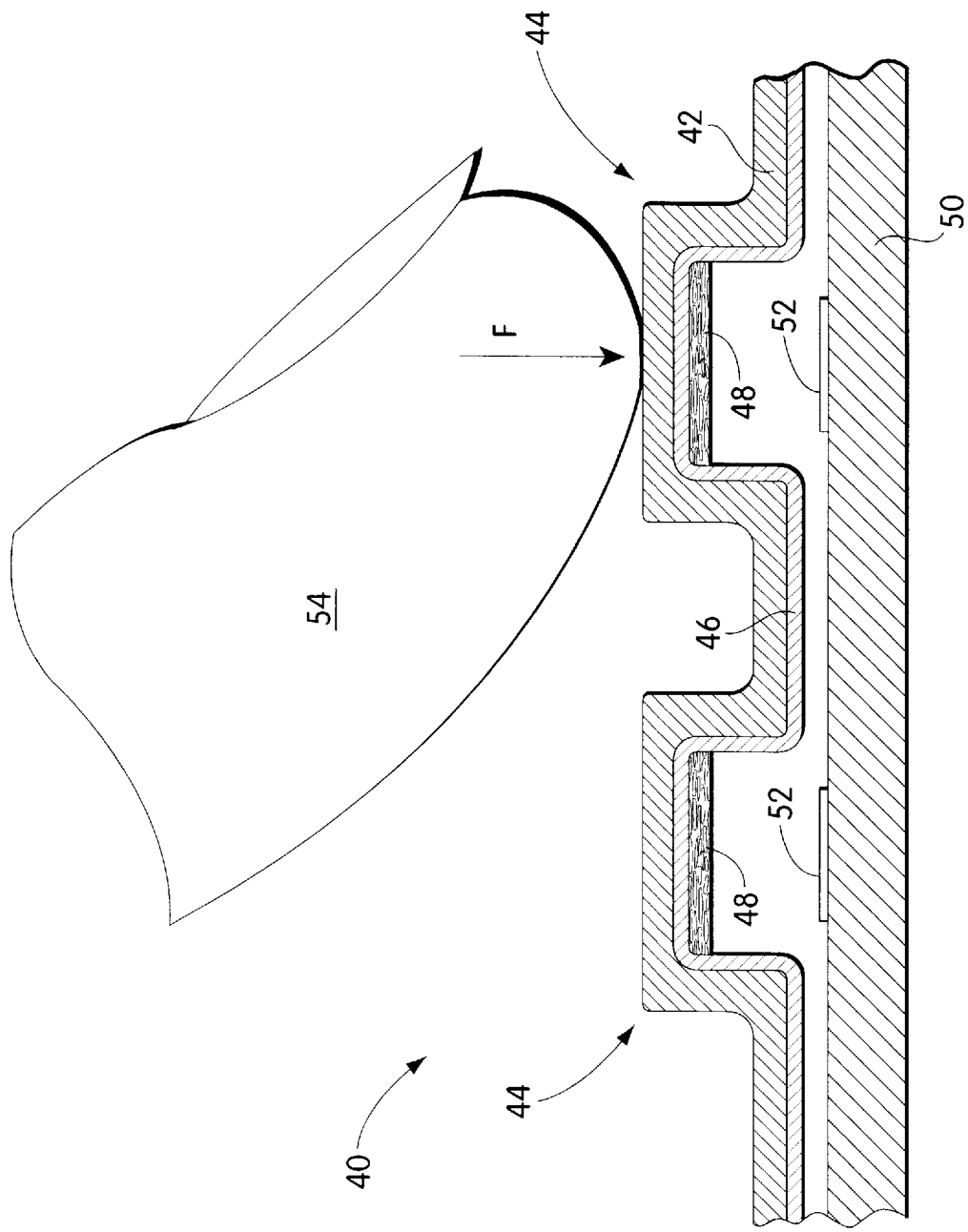
FIG. 3 is a cross-sectional view of a telephone or calculator keypad having a thermoplastic elastomer barrier layer and an elastic conductive layer according to the present invention.

Referring to FIG. 3, there is shown a cross-sectional view of a telephone or calculator keypad 40 comprising an elastic cover 42 which is fabricated of a material that allows contaminants to permeate therethrough (e.g., silicone rubber). The elastic cover 42 has a plurality of keys 44 formed therein. All along the underside of the elastic cover 42, a thermoplastic elastomer barrier layer 46 is grafted to the elastic cover 42. On the bottom surface of the thermoplastic elastomer barrier layer 46, beneath each of the keys 44, an elastic conductive layer 48 is grafted to the thermoplastic elastomer barrier layer 46.

A printed circuit board 50 is positioned beneath the entire elastic cover 42, and conductive traces 52 are formed on the printed circuit board 50 beneath each of the keys 44. Thus, when a force F is applied to one of the keys 44 by, for example, a human finger 54, the corresponding elastic conductive layer 48 will come into electrical contact with the corresponding conductive trace 52, thereby making an electrical connection.

The thermoplastic elastomer barrier layer 46 prevents contaminants, which may permeate through the elastic cover 42, from permeating beyond the elastic cover 42. That is, the thermoplastic elastomer barrier layer 46 prevents contaminants from reaching the elastic conductive layer 48 and the conductive traces 52, thereby preventing corrosion and connection problems. As mentioned above, the thickness of the thermoplastic elastomer barrier layer 46 need typically only be in the range of 0.5 to 5.0 mils in order to prevent contaminants, which are permeating through the elastic cover 42, from permeating beyond the elastic cover 42.

Figure 4:
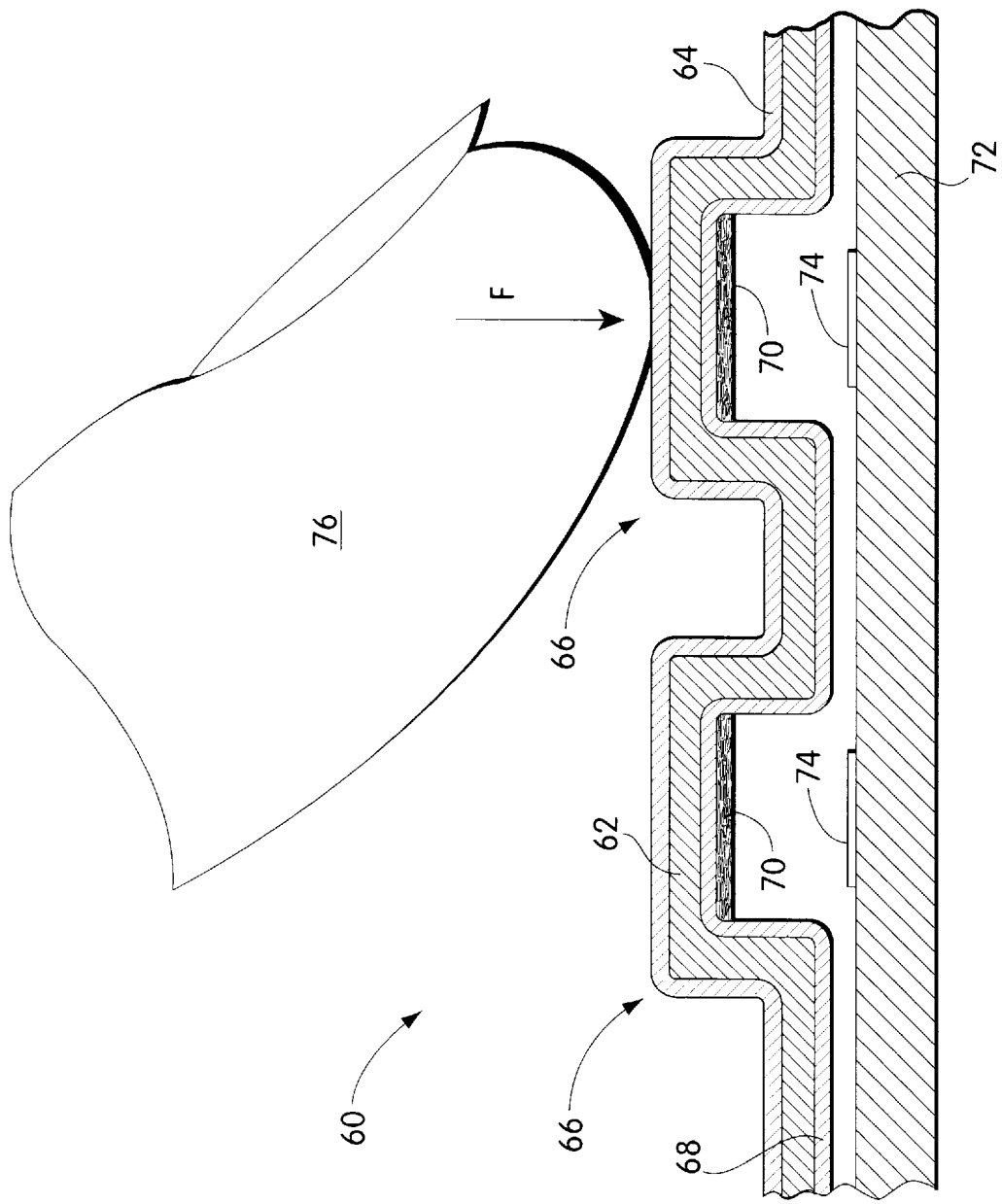
FIG. 4 is a cross-sectional view of a telephone or calculator keypad having two thermoplastic elastomer barrier layers and an elastic conductive layer according to the present invention.

In an alternative embodiment, a thermoplastic elastomer barrier layer may be grafted to the top surface of a telephone or calculator keypad so as to prevent contaminants from ever reaching the keypad. For example, FIG. 4 shows a cross-sectional view of a telephone or calculator keypad 60 comprising an elastic cover 62 which has a thermoplastic elastomer barrier layer 64 grafted to the top surface thereof. The rest of the keypad 60 is similar to the keypad 40 in FIG. 3 in that the elastic cover 62 has a plurality of keys 66 formed therein, a thermoplastic elastomer barrier layer 68 grafted to bottom surface of the elastic cover 62, and an elastic conductive layer 70 grafted to the thermoplastic elastomer barrier layer 68 beneath each of the keys 66. A printed circuit board 72 is again positioned beneath the entire elastic cover 62, and conductive traces 74 are formed on the printed circuit board 72 beneath each of the keys 66. Thus, when a force F is applied to one of the keys 66 by, for example, a human finger 76, the corresponding elastic conductive layer 70 will come into electrical contact with the corresponding conductive trace 74, thereby making an electrical connection.

Similar to the keypad 40 of FIG. 3, the elastic cover 62 is fabricated of a material that will allow contaminants to permeate therethrough (e.g., silicone rubber). However, the thermoplastic elastomer barrier layer 64 will prevent such contaminants from ever reaching the elastic cover 62. Furthermore, the thermoplastic elastomer barrier layer 64 may provide a protective coating for alphanumeric patterns that may be applied to the elastic cover 62 before the thermoplastic elastomer barrier layer 64 is grafted to the elastic cover 62. Such protection may include resistance to scratches, punctures, and other damaging acts.

The thermoplastic elastomer barrier layer 68 provides an additional barrier if for any reason the thermoplastic elastomer barrier layer 64 becomes damaged or otherwise allows contaminants to permeate through the elastic cover 62. Also, as discussed above, the thermoplastic elastomer barrier layer 68 acts as a primer for grafting the elastic conductive layers 70 to the keypad 60.

In view of the above-described embodiments, it is evident that a thermoplastic elastomer barrier layer may be grafted to a substrate so as to prevent contaminants from permeating through the substrate or to prevent contaminants, which may permeate through the substrate, from permeating beyond the substrate. Due to its elastic properties, the thermoplastic elastomer barrier layer may be grafted to a substrate that also has elastic properties, or to a substrate that has flexible or even rigid properties. For the thermoplastic elastomer barrier layer to be most useful, the substrate should be fabricated of a material which allows contaminants to permeate therethrough.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A layered composition comprising:
   a substrate, said substrate having an outer surface, said substrate being formed of a material which allows contaminants to permeate therethrough, said substrate having a first coefficient of expansion; and
   a barrier layer grafted to at least a portion of said outer surface of said substrate, said barrier layer having an outer surface, said barrier layer being formed of a thermoplastic elastomer material which prevents contaminants from permeating therethrough, said barrier layer having a coefficient of expansion substantially equal to said first coefficient of expansion.

2. The layered composition as defined in claim 1, wherein said barrier layer is grafted to said substrate by a thermal process.

3. The layered composition as defined in claim 1, wherein said substrate is formed of an elastic material which allows contaminants to permeate therethrough.

4. The layered composition as defined in claim 1, wherein said substrate is formed of a thermoplastic polyamide which allows contaminants to permeate therethrough.

5. The layered composition as defined in claim 1, wherein said substrate is formed of a thermoplastic polyamide-imide which allows contaminants to permeate therethrough.

6. The layered composition as defined in claim 1, further comprising an elastic electrically conductive layer grafted to at least a portion of said outer surface of said barrier layer, said elastic electrically conductive layer having a coefficient of expansion substantially equal to said first coefficient of expansion.

7. The layered composition as defined in claim 6, wherein said elastic electrically conductive layer is grafted to said barrier layer by a thermal process.

8. The layered composition as defined in claim 7, wherein said barrier layer is grafted to said substrate and said elastic electrically conductive layer is grafted to said barrier layer by a single thermal process.

9. The layered composition as defined in claim 1, wherein the thickness of said barrier layer is in the range of 0.5 to 5.0 mils.

10. A layered composition comprising:

a substrate, said substrate having a top surface and a bottom surface, said substrate being formed of a material which allows contaminants to permeate therethrough, said substrate having a first coefficient of expansion;

a first barrier layer grafted to at least a portion of said top surface of said substrate, said barrier layer being formed of a thermoplastic elastomer material which prevents contaminants from permeating therethrough, said first barrier layer having a coefficient of expansion substantially equal to said first coefficient of expansion;

a second barrier layer grafted to at least a portion of said bottom surface of said substrate, said second barrier layer having an outer surface, said second barrier layer being formed of a thermoplastic elastomer material which prevents contaminants from permeating therethrough, said second barrier layer having a coefficient of expansion substantially equal to said first coefficient of expansion; and an elastic electrically conductive layer grafted to at least a portion of said outer surface of said second barrier layer, said elastic electrically conductive layer having a coefficient of expansion substantially equal to said first coefficient of expansion.

11. The layered composition as defined in claim 10, wherein said first barrier layer is grafted to said substrate by a thermal process.

12. The layered composition as defined in claim 10, wherein said second barrier layer is grafted to said substrate by a thermal process.

13. The layered composition as defined in claim 10, wherein said elastic electrically conductive layer is grafted to said second barrier layer by a thermal process.

14. The layered composition as defined in claim 10, wherein said first barrier layer is grafted to said substrate, said second barrier layer is grafted to said substrate, and said elastic electrically conductive layer is grafted to said second barrier layer by a single thermal process.

15. The layered composition as defined in claim 10, wherein said substrate is formed of a elastic material which allows contaminants to permeate therethrough.

16. The layered composition as defined in claim 10, wherein said substrate is formed of a thermoplastic polyamide which allows contaminants to permeate therethrough.

17. The layered composition as defined in claim 10, wherein said substrate is formed of a thermoplastic polyamide-imide which allows contaminants to permeate therethrough.

18. The layered composition as defined in claim 10, wherein the thickness of said barrier layer is in the range of 0.5 to 5.0 mils.

* * * * *